United States Patent
Kim et al.

(10) Patent No.: US 9,153,749 B2
(45) Date of Patent: Oct. 6, 2015

(54) LIGHT EMITTING DEVICE PACKAGE AND LIGHTING DEVICE WITH THE SAME

(75) Inventors: Mangeun Kim, Anyang-si (KR); Chilkeun Park, Seoul (KR); Sangcheon Kim, Goyang-si (KR); Moongoo Choi, Yongin-si (KR)

(73) Assignee: LG ELECTRONICS INC., Seoul (KR)

( * ) Notice: Subject to any disclaimer, the term of this patent is extended or adjusted under 35 U.S.C. 154(b) by 132 days.

(21) Appl. No.: 13/339,231

(22) Filed: Dec. 28, 2011

(65) Prior Publication Data

US 2012/0267661 A1 Oct. 25, 2012

(30) Foreign Application Priority Data

Apr. 19, 2011 (KR) ......................... 10-2011-0036221

(51) Int. Cl.
| | |
|---|---|
| H01L 33/48 | (2010.01) |
| H01L 33/44 | (2010.01) |
| H01L 33/50 | (2010.01) |
| H01L 33/58 | (2010.01) |
| H01L 33/62 | (2010.01) |

(52) U.S. Cl.
CPC ............... *H01L 33/486* (2013.01); *H01L 33/44* (2013.01); *H01L 33/502* (2013.01); *H01L 33/507* (2013.01); *H01L 33/58* (2013.01); *H01L 33/62* (2013.01); *H01L 2224/48091* (2013.01); *H01L 2224/48227* (2013.01)

(58) Field of Classification Search
CPC ...... H01L 33/507; H01L 33/46; H01L 33/486
USPC .................................................... 257/79, 99
See application file for complete search history.

(56) References Cited

U.S. PATENT DOCUMENTS

| | | | |
|---|---|---|---|
| 7,932,529 B2 * | 4/2011 | Lin et al. .......................... | 257/98 |
| 2007/0024175 A1 | 2/2007 | Chua et al. | |
| 2007/0241661 A1 * | 10/2007 | Yin ................................ | 313/502 |
| 2008/0142817 A1 | 6/2008 | Ibbetson et al. | |
| 2009/0261708 A1 * | 10/2009 | Moseri et al. .................. | 313/501 |
| 2009/0273002 A1 | 11/2009 | Chiou et al. | |
| 2009/0278151 A1 * | 11/2009 | Kim ............................... | 257/98 |
| 2009/0295265 A1 * | 12/2009 | Tabuchi et al. ................ | 313/112 |
| 2010/0012957 A1 * | 1/2010 | Lin et al. .......................... | 257/98 |
| 2010/0051982 A1 | 3/2010 | Lin et al. | |
| 2010/0117530 A1 | 5/2010 | Lin et al. | |
| 2010/0264448 A1 * | 10/2010 | Choi et al. ....................... | 257/98 |
| 2012/0025241 A1 | 2/2012 | Xiao et al. | |

FOREIGN PATENT DOCUMENTS

| | | |
|---|---|---|
| CN | 1908114 A | 2/2007 |
| CN | 101577303 A | 11/2009 |
| CN | 101997074 A | 3/2011 |

* cited by examiner

*Primary Examiner* — Matthew Reames
(74) *Attorney, Agent, or Firm* — Birch, Stewart, Kolasch & Birch, LLP

(57) ABSTRACT

The present invention relates to a light emitting device package and a lighting device with the same. The light emitting device package comprises a package body having a first surface and a second surface, wherein the first surface has a mounting portion positioned thereon, and a through hole provided therein to pass through the first surface and the second surface, at least one pair of first electrodes on the first surface, at least one pair of second electrodes on the second surface connected to the first electrodes through the through hole respectively, a light emitting device on the mounting portion connected to the first electrodes electrically, a light wavelength conversion layer positioned on the light emitting device, and a protective layer on the light wavelength conversion layer for sealing the mounting portion.

19 Claims, 15 Drawing Sheets

LIGHT EMITTING DEVICE PACKAGE AND LIGHTING DEVICE WITH THE SAME

CROSS REFERENCE TO RELATED APPLICATION

This application claims the benefit of the Patent Korean Application No. 10-2011-0036221, filed on Apr. 19, 2011, which is hereby incorporated by reference as if fully set forth herein.

BACKGROUND OF THE DISCLOSURE

1. Field of the Disclosure

The present invention relates to a light emitting device package and a lighting device with the same 2. Discussion of the Related Art A light emitting diode LED, which is a light emitting device fabricated by a semiconductor fabrication process, was started to be put into practical use in an end of 1960s after observation of light emission upon application of a voltage to a semiconductor device in 1920s.

Thereafter, there have been ceaseless researches and developments for improving efficiency of the LED, and particularly, interest on the LED having a light characteristic enough to replace the present light source is becoming higher day by day. And, along with the increased researches on the LED, researches on the LED package and the lighting device with the same are also being made actively.

In order to obtain a high efficiency package, it is important to maximize a quantity of a light extracted to an outside from a light emitted from the LED.

In general, the package used for the lighting device may be a white color package. To do this, a fluorescent material coated on the LED may be used for changing a wavelength of the light.

SUMMARY OF THE DISCLOSURE

Accordingly, the present invention is directed to a light emitting device package and a lighting device with the same.

An object of the present invention is to provide a light emitting device package and a lighting device with the same, which can improve extraction efficiency of a light from a light emitting device.

Another object of the present invention is to provide a light emitting device package and a lighting device with the same, in which a quantum dot phosphor is used for providing a high efficiency light emitting device.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device package comprises a package body having a first surface and a second surface, wherein the first surface has a mounting portion positioned thereon, and a through hole provided therein to pass through the first surface and the second surface, at least one pair of first electrodes on the first surface, at least one pair of second electrodes on the second surface connected to the first electrodes through the through hole respectively, a light emitting device on the mounting portion connected to the first electrodes electrically, a light wavelength conversion layer on the light emitting device, and a protective layer on the light wavelength conversion layer for sealing the mounting portion.

In another aspect of the present invention, a light emitting device package comprises a package body having a first surface and a second surface, wherein the first surface has a mounting portion positioned thereon, and a through hole provided therein to pass through the first surface and the second surface, at least one pair of first electrodes on the first surface, at least one pair of second electrodes on the second surface connected to the first electrodes through the through hole, the second electrode having an inserting portion projected downward, a light emitting device on the mounting portion connected to the first electrodes electrically, a light wavelength conversion layer on the light emitting device, and a protective layer on the light wavelength conversion layer for sealing the mounting portion, and a circuit board having an inserting hole for inserting the inserting portion of the second electrode therein.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are comprised to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

While the present invention permits different variations and modifications, specific embodiment thereof will be illustrated with drawings and will be described hereinafter. However, the present invention is not intended to limit the present invention to a specific one disclosed herein, and contrary to this, the present invention comprises all modifications, substitutions, equivalences thereof in agreement of the aspect of the present invention defined by the claims of the present invention.

In a case if it is described that an element, like a layer, a region, or a substrate, is "on" other element, it is understandable that the element is on the other element directly, or there may be another intermediate element between the two elements.

Even though words, such as first and second, may be used for describing different elements, components, regions, layers and/or regions, it is understandable that the elements, components, regions, layers and/or regions are not limited by such words.

Figure 1:
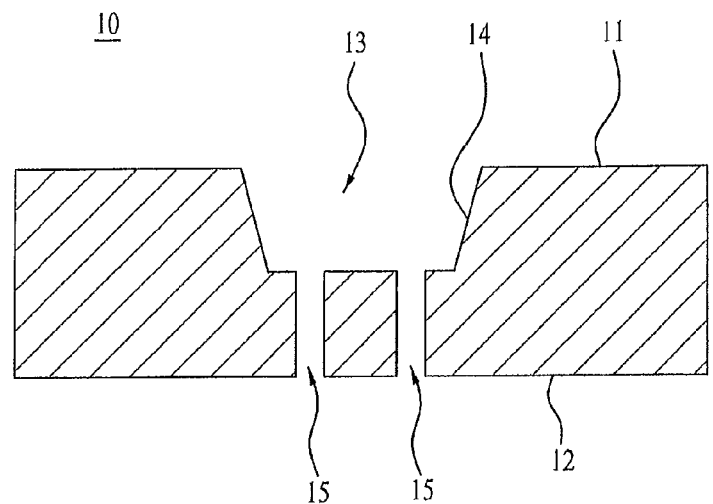
FIG. 1 illustrates a section of an exemplary package body.
Figure 2:
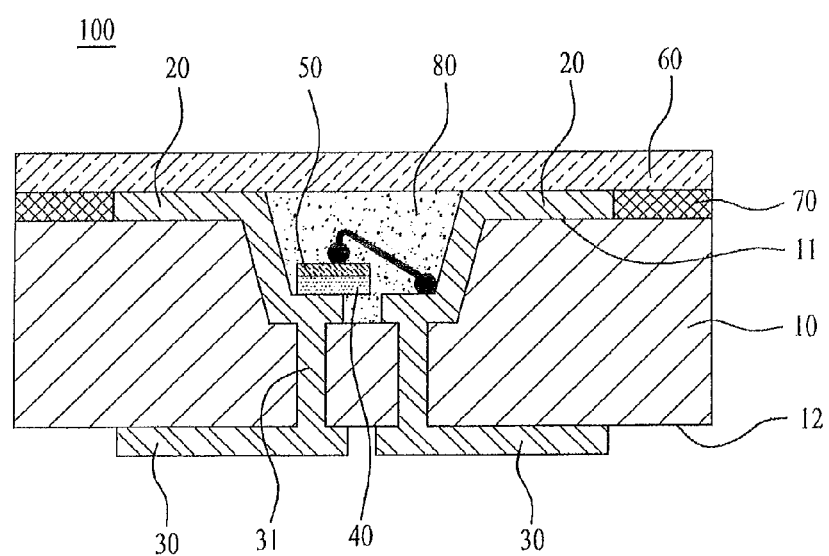
FIG. 2 illustrates a section of an exemplary package.

Referring to FIGS. 1 and 2, the light emitting device package 100 comprises a package body 10 having a first surface 11, a second surface 12 which is opposite to the first surface 11, and a mounting portion 13 on the first surface 11 for mounting a light emitting device 40 thereon. The package body 10 may be formed of ceramic or silicon.

The package body 10 has a through hole 15 which passes through the package body 10 from the mounting portion 13 to the second surface 12, and the mounting portion 13 has a sloped side for upward reflection of a light. That is, the mounting portion 13 has an inward recess from the first surface 11, or depending on cases, may be flush with the first surface 11 to form a flat surface.

The package body 10 has at least one pair of electrodes 20 and 30 positioned thereon including a first electrode 20 on the first surface 11 and a second electrode 30 on the second surface 12 connected with an electrode metal 31 in the through hole 15, electrically.

A light emitting device 40, such as a light emitting diode may be mounted to the first electrode 20 at the mounting portion 13 by wire bonding as shown or, depending on cases, by flip chip bonding, or, by soldering a bottom side electrode positioned on an underside of the light emitting device to the first electrode 20, directly.

And, there is a light wavelength conversion layer 50 including a light wavelength converting material, such as a phosphor (or fluorescent material), positioned on the light emitting device 40 for converting at least some of wavelengths of the light from the light emitting device 40, and mixing the light with converted wavelengths with the light from the light emitting device 40, to convert the light from the light emitting device 40 to a light of other wavelengths.

One example of the light wavelength converting material may be phosphor, the fluorescent material, and Quantum Dot phosphor (QD phosphor).

The quantum dot phosphor has a great advantage if the quantum dot phosphor is used together with the light emitting device. If it is described taking the phosphor (or fluorescent material) as a main material of a host material, though there are many kinds of YAG, TAG, and Silicate group oxide phosphor (or fluorescent material), and a sulfide group, those materials may fail to meet reliability on durability, wet endurance, color temperature stability, and the like.

However, the nitride or oxy-nitride host material developed and being applying recently has strong covalent bond of a nitrogen atom instead of an oxygen atom in the present oxide to have a high stability, and to shift exciting and light emitting wavelengths to long wavelengths, to be suitable for application to a blue color light emitting device.

And, in comparison to an organic fluorescent dye used generally, the quantum dot phosphor which is light emitting nano particles has very excellent advantages of production of different light spectra of identical composition by means of a quantum confinement effect made by particle size control, very high quantum yield higher than 80%, and very good color purity and color rendering.

Positioned on the mounting portion 13 having the light emitting device 40 mounted thereto, there is an encapsulation 80. Depending on cases, in addition to, or instead of, the light wavelength conversion layer 50, the light wavelength conversion material, such as the phosphor (or fluorescent material), may be comprised to the encapsulation 80.

Positioned on the mounting portion 13, there is a protective layer 60 for protecting and damp proofing the light emitting device 40, the light wavelength conversion layer 50, and wires together with the encapsulation 80.

The protective layer 60 covers the mounting portion 13, and positioned on the first surface 11 bonded to the first surface 11 with an adhesive layer 70 positioned at least a portion of an edge of the first surface 11, firmly.

In this instance, as shown, the adhesive layer 70 may be positioned in contact with a side of the first electrode 20, the adhesive layer 70 can improve air tightness of the mounting portion 13, further.

Different variations will be described with reference to drawings, and description made with reference to FIGS. 1 and 2 may be applied to parts not described in following variations in identical fashion. And, it is natural that technical matters on the following variations may be applied to one another.

Figure 3:
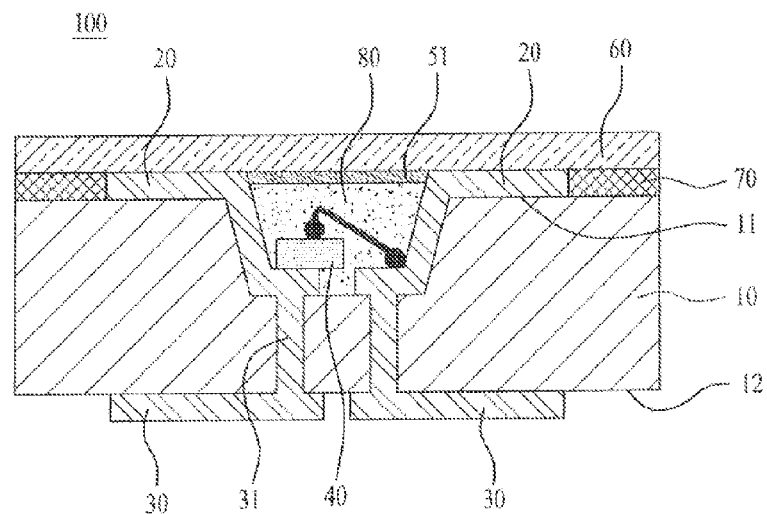
FIG. 3 illustrates a section of an exemplary case having a spaced light wavelength conversion layer.

FIG. 3 illustrates an example in which the light wavelength conversion layer 51 is mounted spaced from the light emitting device 40. The light wavelength conversion layer 51 spaced thus prevents the light emitted from the light emitting device 40 and reflected at the light wavelength conversion layer 51 from re-absorbing to the light emitting device 40 again.

And, since the light wavelength conversion layer 51 is spaced from the light emitting device 40 which is a heat generation source so as to be stable thermally, and protected by the protective layer 60, the light wavelength conversion layer 51 has very good reliability.

Figure 4:
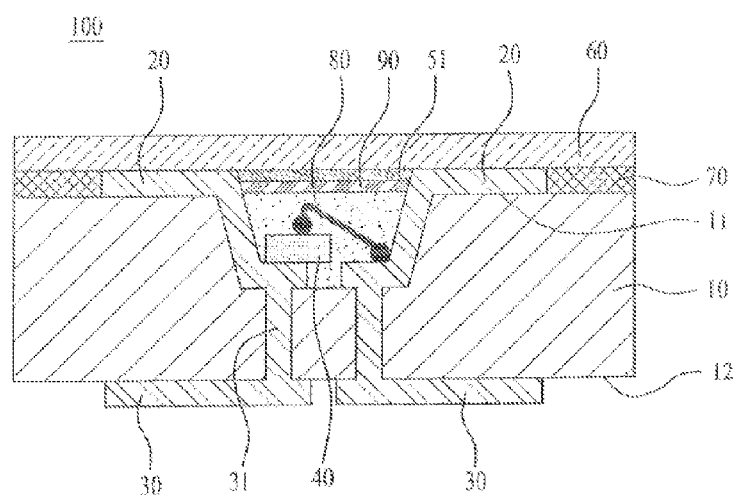
FIG. 4 illustrates a section of an exemplary case having double reflective film.

FIG. 4 illustrates a structure having a multiple reflective film 90 together with the light wavelength conversion layer 51 spaced thus.

Figure 5:
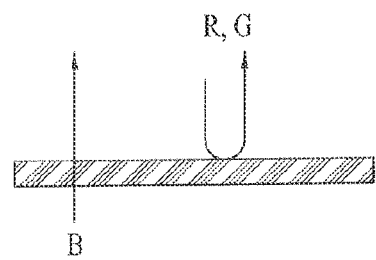
FIG. 5 illustrates a schematic view of double reflective film.

The multiple reflective film 90 can transmit a light of a specific wavelength while reflecting rest of the light. For an example, as shown in FIG. 5, the multiple reflective film 90 may transmit a blue light (B) while reflecting other lights including a red light (R) and a green light (G).

Thus, the multiple reflective film 90 transmits the blue light (B) from the light emitting device 40 so as to be extracted to an outside, and of a yellow light of which wavelength is converted by the phosphor (or fluorescent material) comprised to the light wavelength conversion layer 51, the light reflected and returned is made, not to be absorbed by the protective layer 60 or overlying lens, but to reflect, to minimize a loss of light, thereby improving the light extraction efficiency, further.

Figure 6:
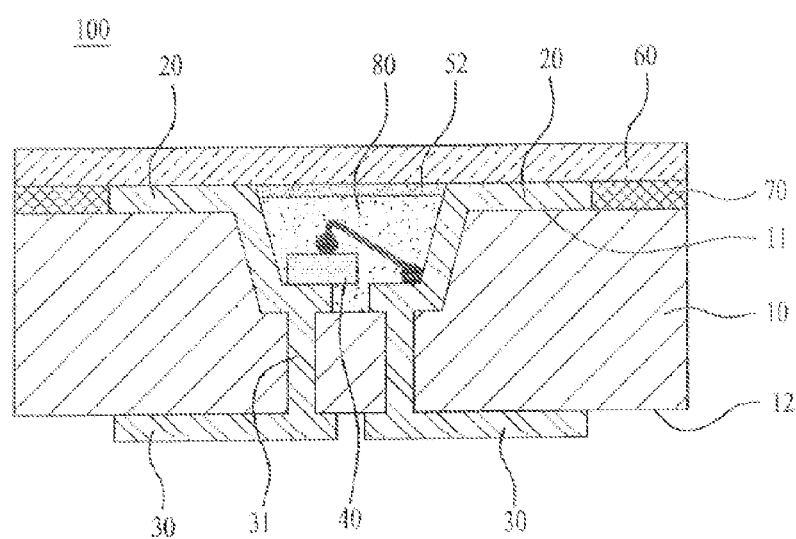
FIGS. 6 and 7 illustrate sections of other exemplary cases having light wavelength conversion layers, respectively.

FIG. 6 illustrates a light wavelength conversion layer 52 having the quantum dot phosphor described before mixed therewith positioned spaced from the light emitting device 40. The quantum dot phosphor can improve the color rendering and light efficiency.

Figure 7:
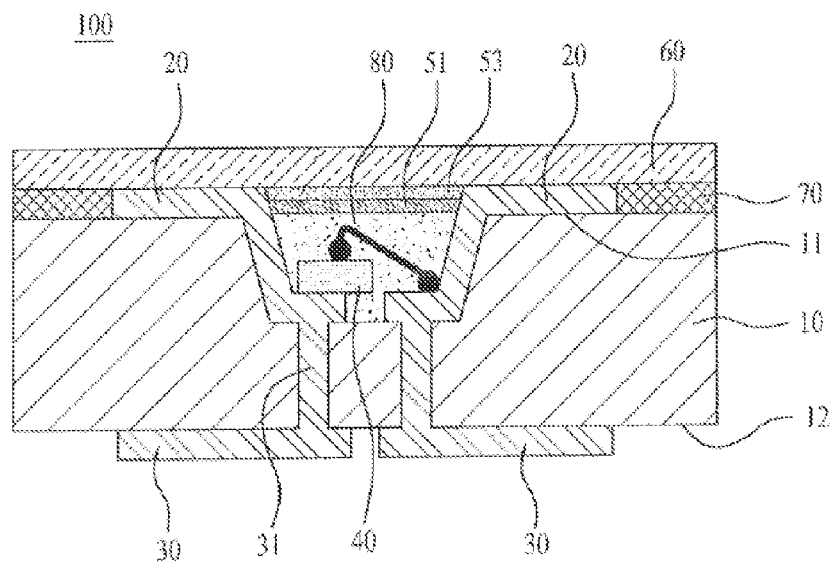

FIG. 7 illustrates an example in which the light wavelength conversion layer 51 positioned spaced from the light emitting device 40 as shown in FIG. 4, and an additional quantum dot phosphor 53 are provided together. In a case the light emitting device 40, and the quantum dot phosphor 53 are provided together, the color rendering and light efficiency can be improved, too.

Figure 8:
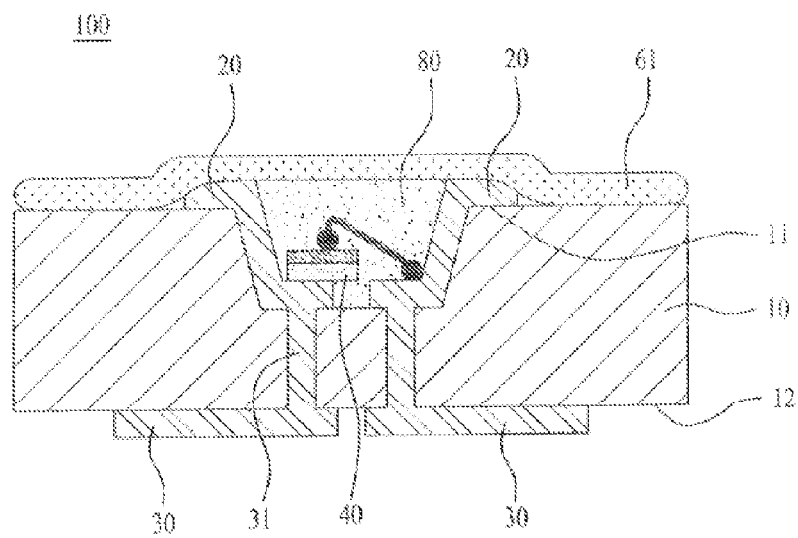
FIGS. 8 and 9 illustrate sections of other exemplary cases having protective layers, respectively.

The protective layer 60 described above may be formed of glass or plastic resin. FIG. 8 illustrates an example of a protective layer 61 which is formed of a material having good damp proofing property, such as glass, and with or without a very thin adhesive layer.

Figure 9:
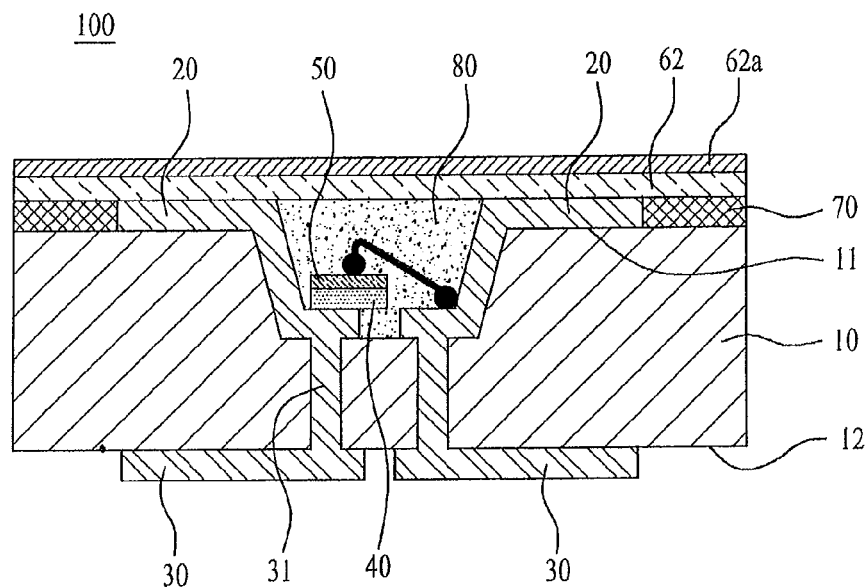

And, FIG. 9 illustrates an example in which a protective layer 62 of a plastic resin film and a damp proof layer 62a are positioned on the protective layer 62. Of course, instead of the damp proof layer 62a, a damp proof material may be placed in the mounting portion 13.

Figure 10:
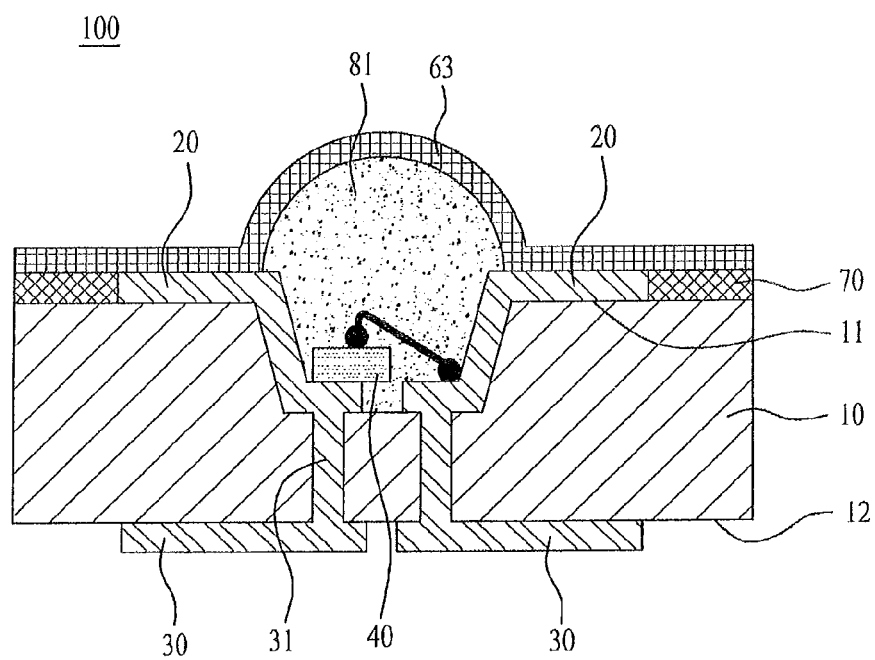
FIGS. 10 and 11 illustrate sections of exemplary cases having lens shaped encapsulations, respectively.

FIG. 10 illustrates an example of a lens shaped encapsulation 81. The lens shaped encapsulation 81 may comprise a light wavelength conversion material. And, a protective layer 63 having a lens shaped curve surface may be placed on the lens shaped encapsulation 81 in conformity thereto. Depending on cases, the protective layer 63 may also comprise the light wavelength conversion material.

Figure 11:
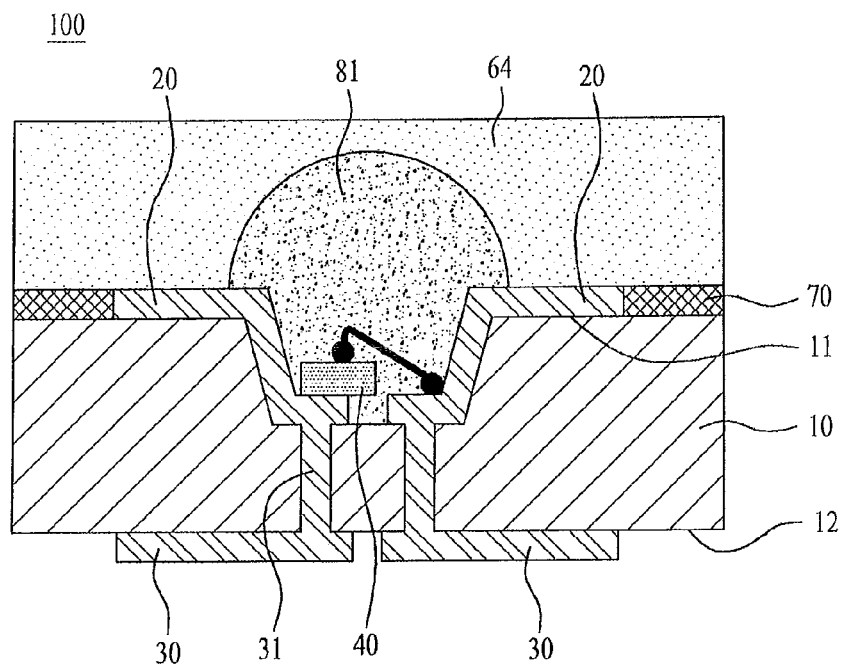

In the meantime, referring to FIG. 11, not the curved shaped, but a box shaped, protective layer 64 may be placed on the lens shaped encapsulation 81. In this instance, as shown, the protective layer 64 may also have a curve shape at a portion the protective layer 64 is in contact with the lens shaped encapsulation 81.

Figure 12:
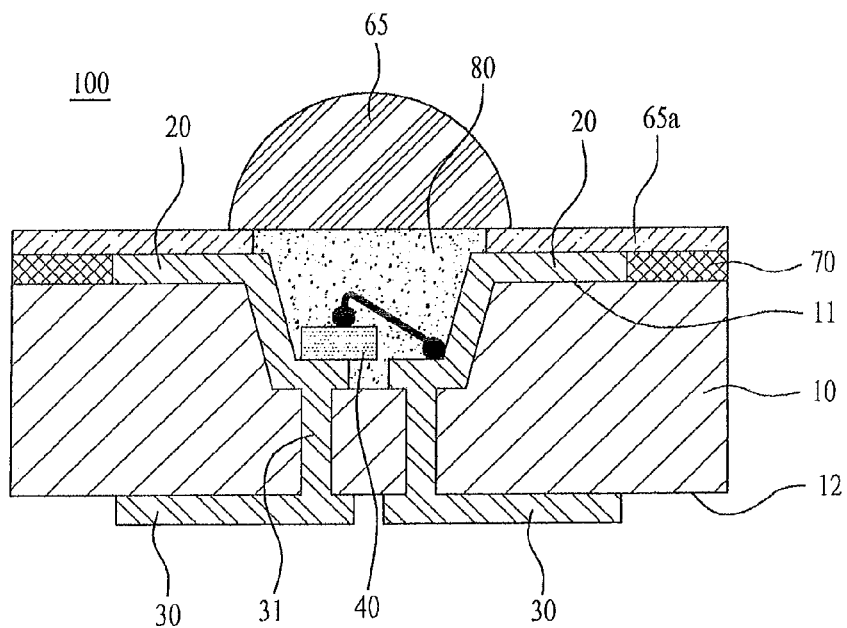
FIGS. 12 to 16 illustrate sections of exemplary cases having protective layers including lens shapes, respectively.

Referring to FIG. 12, a lens shaped protective layer 65 may be provided. In this instance, there may be a connection layer 65a between the protective layer 65 and the adhesive layer 70, additionally.

Figure 13:
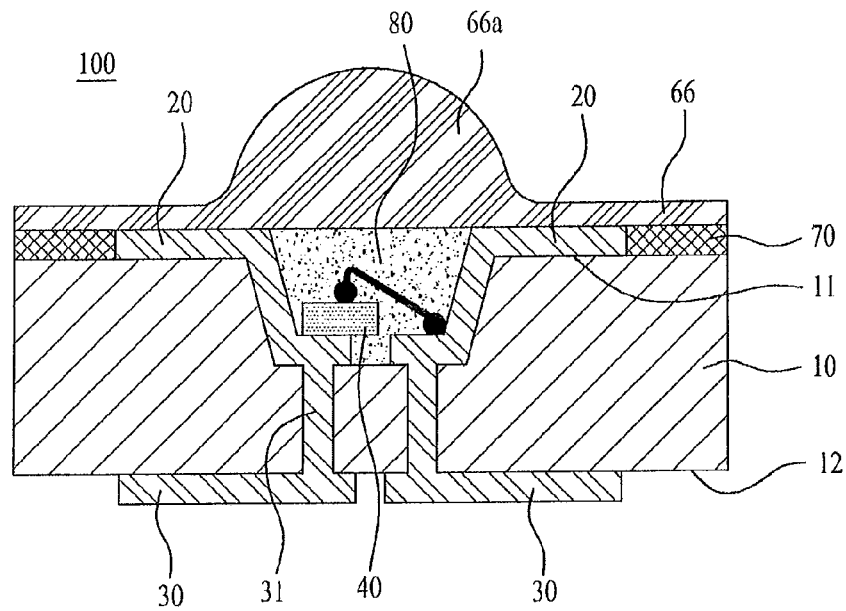

And, referring to FIG. 13, a lens shaped 66a protective layer 66 may be mounted with the adhesive layer 70. That is, the lens shape 66a and the protective layer 66 may be formed as one unit.

Figure 14:
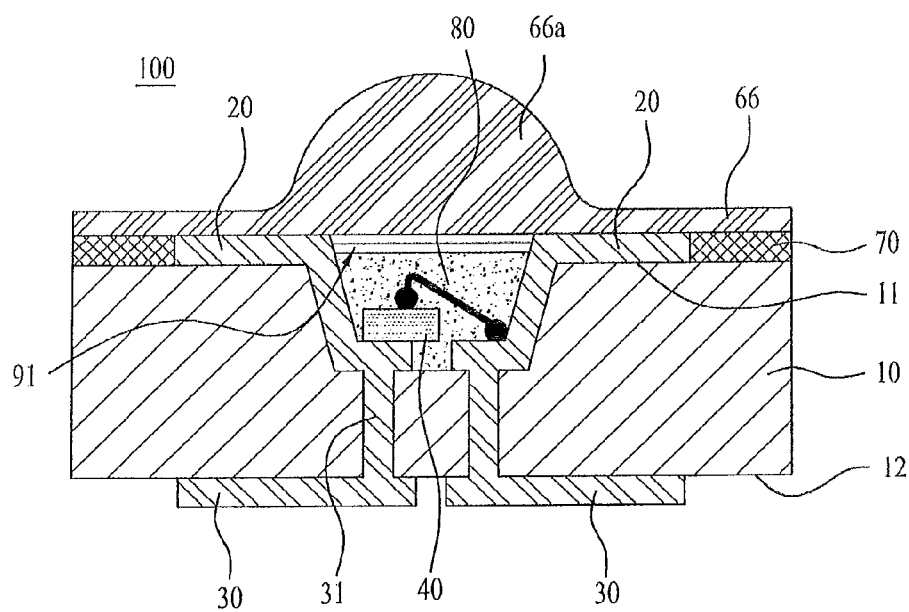

FIG. 14 illustrates an example in which an anti-reflection layer 91 is positioned on the light emitting device 40 in an example the lens shape 66a and the protective layer 66 are formed as one unit like FIG. 13.

The anti-reflection layer 91 has at least a stack of alternate pairs of layers having refractive indices different from one another for reducing reflectivity of an underside of the protective layer 66. The anti-reflection layer 91 may be deposited on the underside of the protective layer 66 or positioned on the encapsulation 80, additionally.

In the exemplary structure described with reference to any one of FIGS. 12 to 14, it is natural that the encapsulation 80 may comprise the light wavelength conversion material, or an additional light wavelength conversion material layer may be provided to the encapsulation 80.

Figure 15:
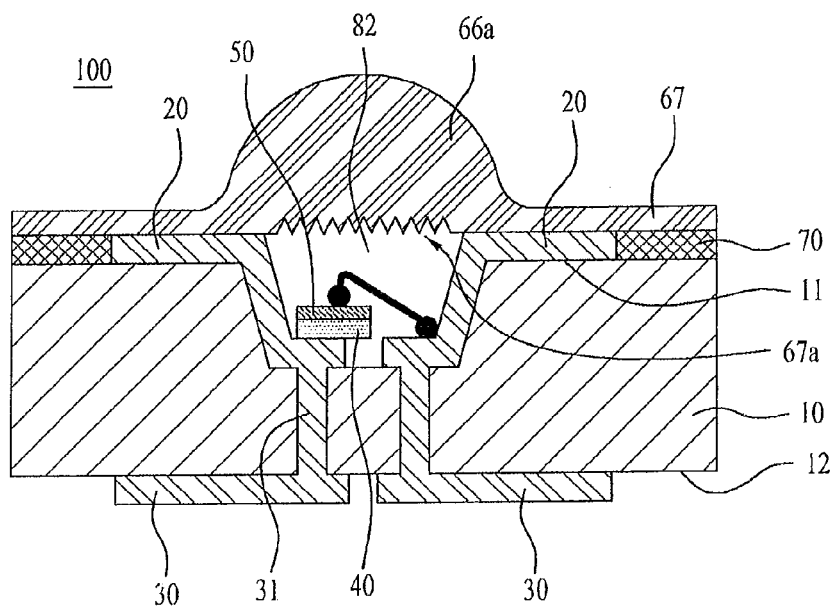

Referring to FIG. 15, instead of the encapsulation 80, gas 82 may be injected for damp proof and/or anti-oxidation. The gas 82 may be stable gas including nitrogen.

In this case, it is beneficial that a light wavelength conversion layer 50 is provided in direct contact with an upper side of the light emitting device 40.

In this instance, a lens shaped 66a protective layer 67 is provided on the light emitting device 40, having a light extraction pattern 67a on a side facing the light emitting device 40.

The light extraction pattern 67a prevents total reflection at the underside of the protective layer 67 from taking place for effective outward extraction of the light from the light emitting device 40.

Figure 16:
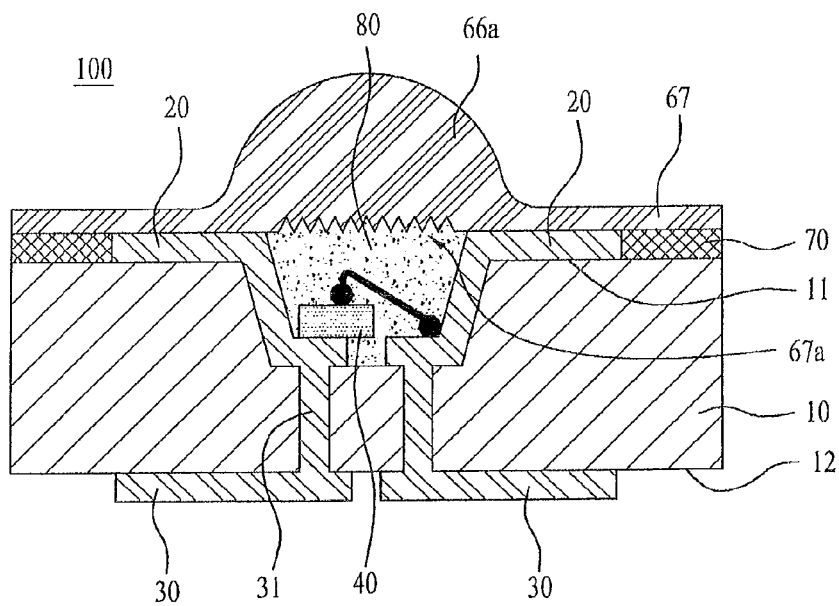
Figure 17:
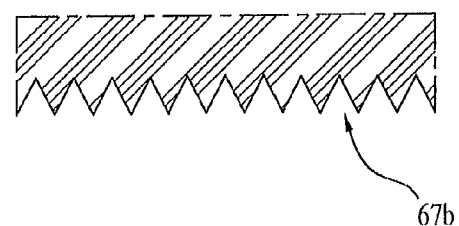
FIG. 17 illustrates a section of an exemplary light extraction pattern.

Referring to FIG. 16, the encapsulation 80 may be provided in the mounting portion in the example shown in FIG. 15. In this instance, as described before, the light wavelength conversion material may be comprised to the encapsulation 80.

The light extraction pattern 67a described in FIGS. 15 and 16 may be an uneven pattern of repetitive regular unit structures. However, even in a case various patterns including a random pattern are applied, the anti-reflection and the light extraction can be improved.

Figure 18:
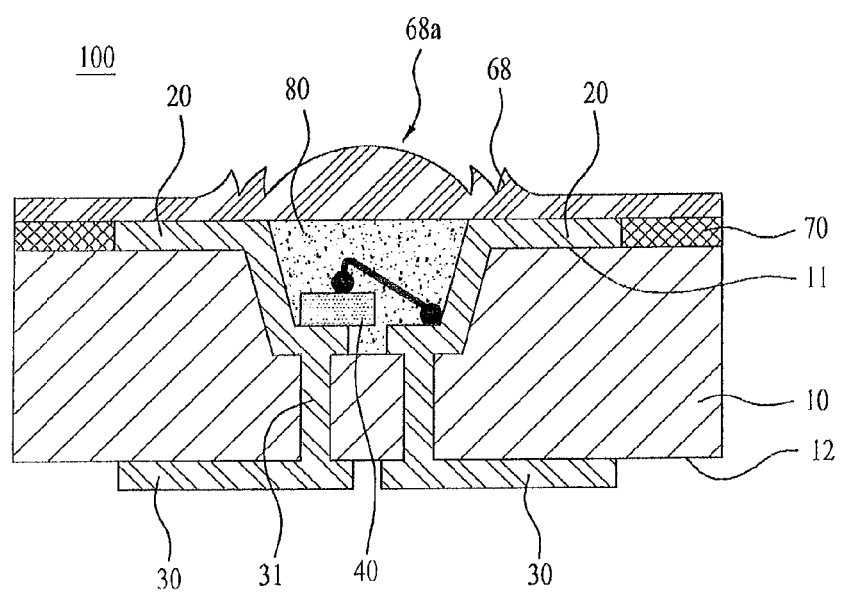
FIGS. 18 and 19 illustrate sections of examples of protective layers including different lens shapes, respectively.
Figure 19:
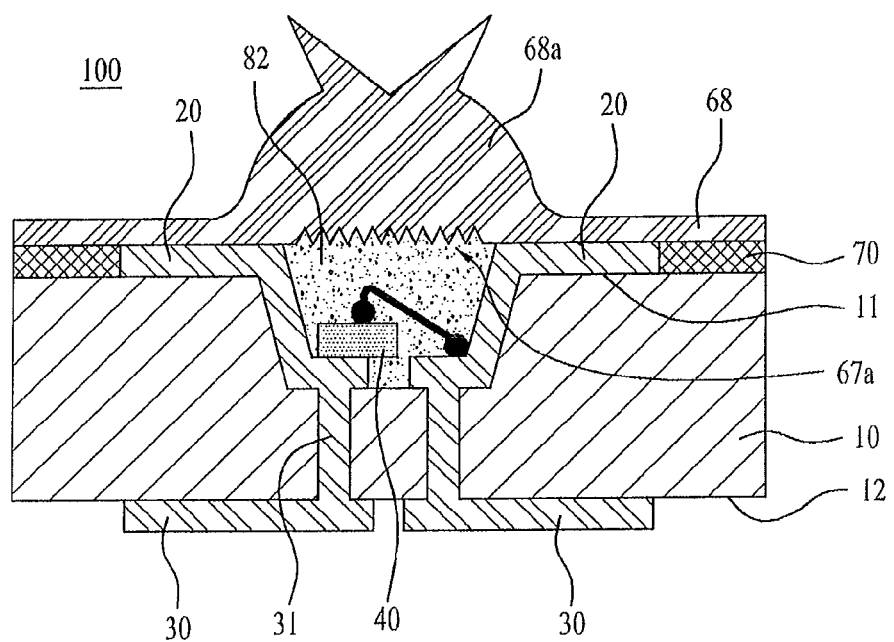

In the meantime, a protective layer of various lens shapes may be provided, such as a protective layer 68 of a Fresnel lens pattern 68a as shown in FIG. 18, or a protective layer 68 of a lens pattern 68a for changing a beam angle of the light as shown in FIG. 19.

The Fresnel lens pattern 68a in FIG. 18, and the lens pattern 68a in FIG. 19 make the light from the light emitting device 40, not to concentrate at a center, but to spread, uniformly.

The light emitting device package 100 described above may be mounted to a circuit board, such as PCB, to be constructed as a lighting device. When the package 100 is mounted to the circuit board, the second electrode 30 may be mounted to a pattern of the circuit board by using a surface mounting technology.

Figure 20:
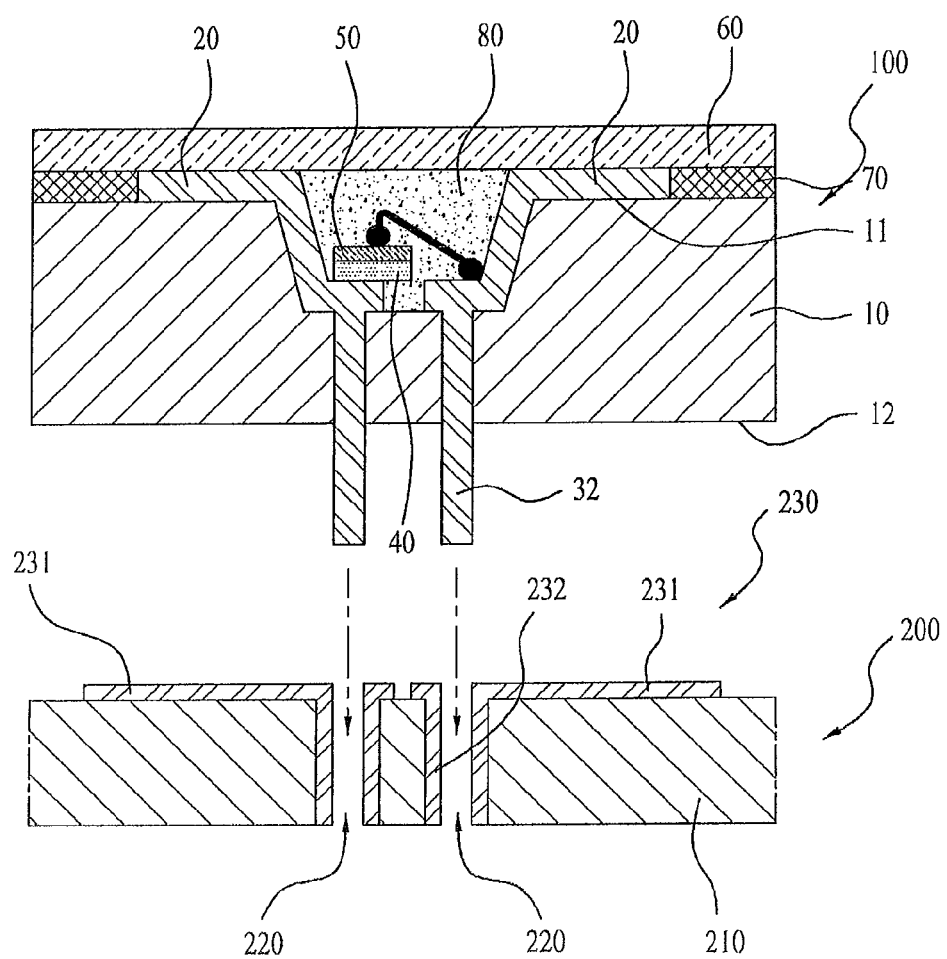
FIGS. 20 and 21 illustrate sections of examples of lighting devices with packages, respectively.

And, referring to FIG. 20, the second electrode 32 may be placed in, and mounted to, the circuit board 200, directly. In this case, it is beneficial that the second electrode 32 is provided with an inserting portion projected downward.

That is, it is beneficial that the second electrode 32 has a shape of downward projection, extended with adequate thickness and length for securing the package 100 to the circuit board 200, rigidly.

In this instance, the second electrode 32 of the inserting portion shape is placed in inserting holes 220 in the circuit board. By forming the inserting hole 220 to have a size the same or smaller than the second electrode 32, the second electrode 32 may be fixed in the inserting hole 220 after inserting the second electrode 32 therein owing to ductility of a material of the second electrode 32. That is, the second electrode 32 may be mounted by press fit.

The circuit board 200 has a substrate body 210 having the inserting hole 220 with a metal pattern 231 and 232 mounted thereto. The metal pattern 231 and 232 is placed in the inserting hole 220 too for electric connection of the second electrode 32 to the metal pattern 231 and 232 in a case the package 100 is mounted to the circuit board 200.

Though FIG. 20 illustrates two second electrodes 32 and two inserting holes 220, there is no limitation on a number of the second electrodes 32 and the inserting holes 220.

Thus, by inserting and mounting the package 100 to the circuit board 200, no additional high temperature process, such as soldering, may be required. Such state of mounting may be more beneficial in a case the quantum dot phosphor is used as the light wavelength conversion material.

As described before, though the quantum dot phosphor is beneficial thus, since the quantum dot phosphor is susceptible to heat, by mounting the package 100 with the inserting process without the soldering which is high temperature process, degradation or impairing of the quantum dot phosphor by heat can be prevented.

Figure 21:
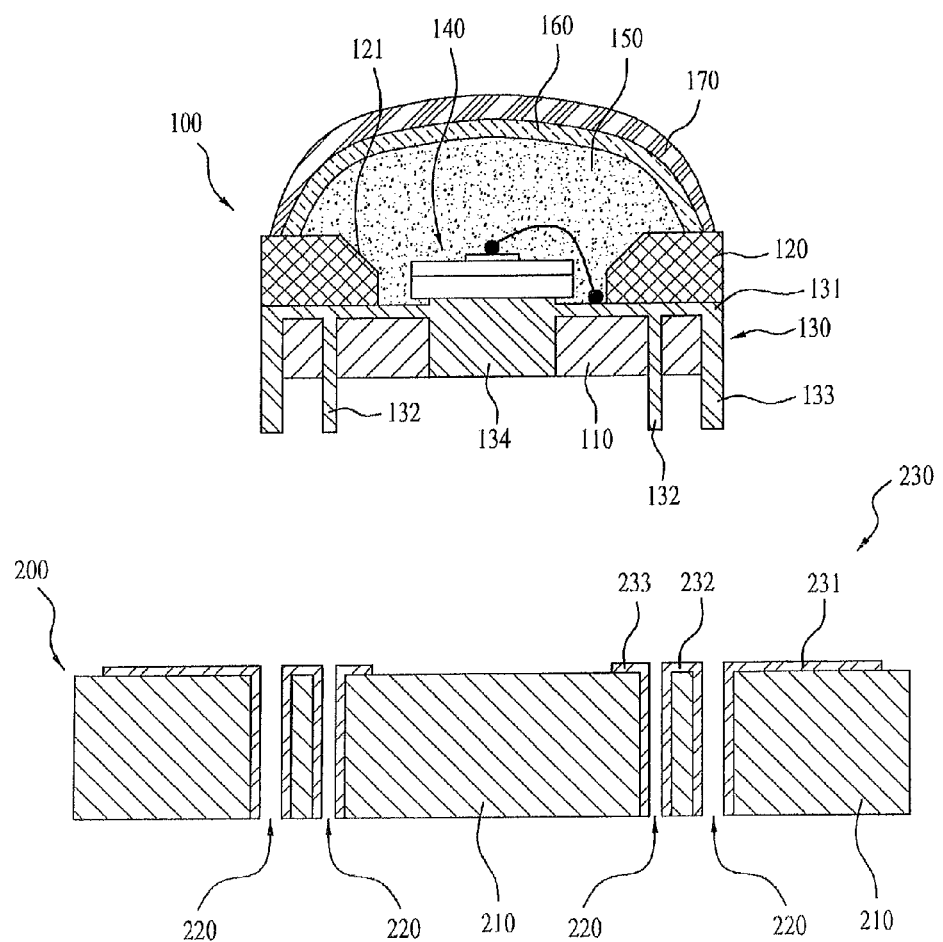

FIG. 21 illustrates a section of another example of the package 100 and the circuit board 200.

Referring to FIG. 21, the package 100 has a first substrate 110 with a first electrode 131, a second electrode 132 and 133, and a heat sink 134 mounted thereto, and a light emitting device 140 on the heat sink 134 connected to the first electrode 131 with a wire.

In this instance, since the second substrate 120 with a reflective surface 121 may be mounted on the first substrate 110, the second substrate 120 may reflect the light from the light emitting device 140 upward, and the second substrate 120 may serve as a mounting portion for mounting the light emitting device 140 thereto.

The encapsulation 150 may be positioned on a portion the light emitting device 140 is mounted thereto, the light wavelength conversion layer 160 may be positioned on the encapsulation 150, and a cap layer 170 of glass or silicone may be positioned on the light wavelength conversion layer 160.

In this instance, the light wavelength conversion layer 160 may comprise the light wavelength conversion material, as an example, the quantum dot phosphor. However, of course, all of the various materials described in the example illustrated in FIG. 2 may be used. And, the encapsulation 150 may also comprise the light wavelength conversion material.

The substrate board 210 of the circuit board 200 having the package 100 mounted thereto may have one pair of through holes on left and right sides matched to the second substrate 120.

Positioned on the substrate body 210 and in the through holes 220 of the circuit board 200, there are metal patterns 231, 232, and 233.

Thus, as the one pair of the second electrodes 132 and 133 projected downward to form the inserting portion on the left and right sides of the package 100 are inserted in the inserting holes 220 provided matched to the second electrodes 132 and 133 respectively, the package 100 may be mounted to the circuit board 200.

A process for fabricating the package 100 will be described.

Figure 22:
FIGS. 22 to 26 illustrate sections of examples of a process for fabricating a package.
Figure 23:
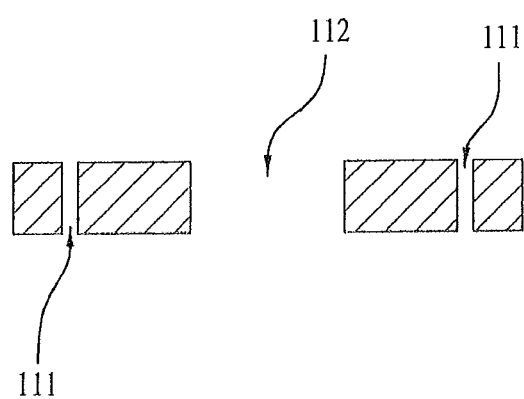
Figure 24:
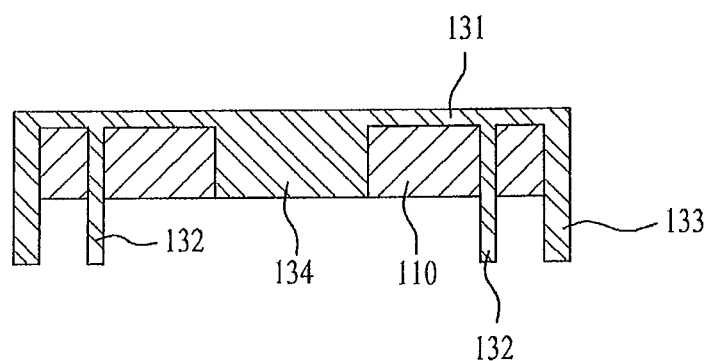

Referring to FIG. 22, a first substrate 110 is provided to be positioned on an underside of the package, and, as shown in FIG. 23, a through hole 111 and a hole 112 for forming a sink are formed in the first substrate 110.

Then, a lead frame is mounted to the substrate 110 to comprise electrodes 131, 132, and 133 and a heat sink 134.

The lead frame has the first electrode 131 on an upper surface of the first substrate 110, a second electrode 132 and 133 in through holes 111 and edges of the first substrate 110, and the heat sink 134 in the hole 112. That is, the second electrodes 132 and 133 may be two or more than two branches from one first electrode 131.

Figure 25:
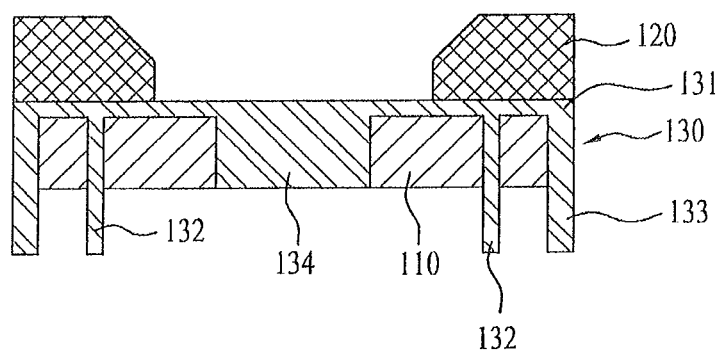

Then, referring to FIG. 25, a second substrate 120 is bonded to an upper surface of the first substrate 110.

Figure 26:
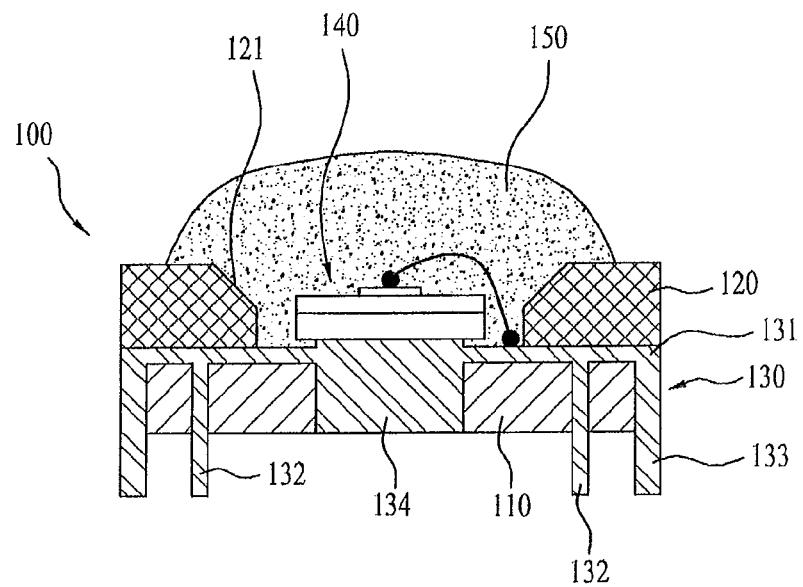
Figure 27:
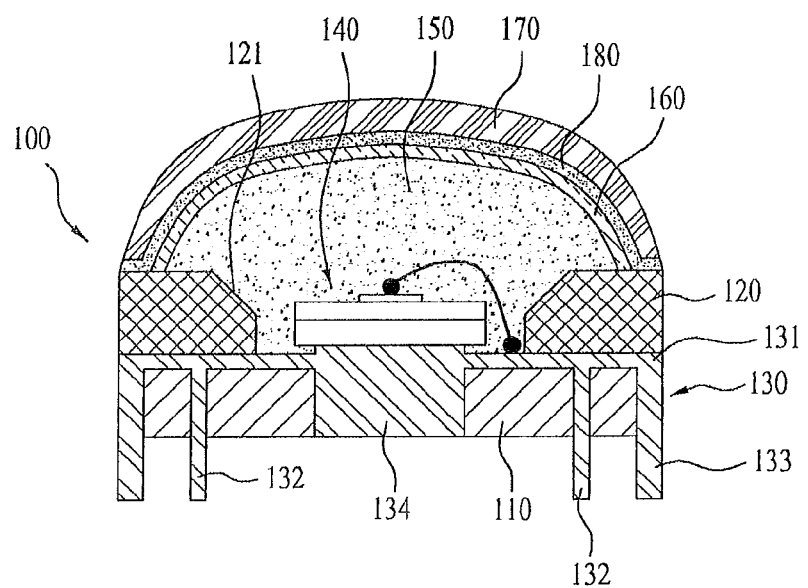
FIG. 27 illustrates a section of another example of a package.

Then, referring to FIG. 26, a light emitting device 140 is mounted on the heat sink 134 of the lead frame to be connected to the first electrode 131, and an encapsulation 150 is formed on the light emitting device 140.

And, upon formation of a light wavelength conversion layer 160 and a cap layer 170 on the encapsulation 150, formation of a package 100 is finished as shown in FIG. 21.

In the meantime, there may be a protective layer 180 between the light wavelength conversion layer 160 and the cap layer 170 for protecting the light wavelength conversion layer 160. Description related to the protective layer 60 described before are applicable to the protective layer 180 in an identical fashion.

As has been described, the exemplary light emitting device has the following advantages.

The quantum dot phosphor used in the exemplary light emitting device permits to improve color purity and color rendering of the light emitting device, significantly. In general, though the quantum dot phosphor is susceptible to heat and humidity, since the light wavelength conversion layer having the quantum dot phosphor is positioned spaced from the light emitting device which is a source of heat generation, the quantum dot phosphor is stable in view of heat and has very excellent reliability owing to protection by the protective layer.

And, the multiple reflective film applied to the package can minimize a loss of the light by transmitting the blue light (B) from the light emitting device and extracting the same to outward, and, of the yellow light having a wavelength converted by the phosphor (or fluorescent material) comprised to the light wavelength conversion layer, reflecting the reflected and returned light again without absorbed by the protective layer or an overlying lens, thereby improving the light extraction efficiency, further.

Moreover, the light extraction pattern applied to the protective layer of the package prevents total reflection at an underside surface of the protective layer, permitting effective outward extraction of the light emitted from the light emitting device.

In the meantime, since the light emitting device package may be mounted to the circuit board without a high temperature process, such as soldering, degradation of material characteristics of the quantum dot phosphor may be prevented.

Accordingly, it is expected that the embodiments of the present invention are applicable to a high quality backlight unit which requires high color rendering by material characteristics of the quantum dot phosphor, or a lighting device with the light emitting device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package comprising:
a package body having a first surface and a second surface, wherein a mounting portion is positioned in the package body, and a through hole is provided therein to pass through the first surface and the second surface, wherein the mounting portion has an inward recess from the first surface toward the second surface;
at least one pair of first electrodes on the first surface, wherein the first electrodes are extended to a side of the mounting portion;
at least one pair of second electrodes on the second surface connected to the first electrodes through the through hole, respectively;
a light emitting device on the mounting portion connected to the first electrodes, electrically;
a light wavelength conversion layer in the inward recess;
a protective layer on the light wavelength conversion layer for sealing the mounting portion, wherein the protective layer is configured for damp proofing the light wavelength conversion layer; and
a double reflective layer or multiple reflective film configured to be a planar shape, arranged between the protective layer and the light emitting device, and which transmits and reflects a light selectively,
wherein the double reflective layer or multiple reflective film is arranged in the inward recess and under the light wavelength conversion layer.

2. The light emitting device package as claimed in claim 1, wherein the protective layer is mounted to the first surface with an adhesive layer.

3. The light emitting device package as claimed in claim 2, wherein the adhesive layer is positioned along an edge of the first surface.

4. The light emitting device package as claimed in claim 1, wherein the protective layer has a lens shape.

5. The light emitting device package as claimed in claim 1, wherein the protective layer has a light extraction pattern provided thereto.

6. The light emitting device package as claimed in claim 1, further comprising an encapsulation on the light emitting device.

7. The light emitting device package as claimed in claim 1, further comprising an anti-reflection layer on the light emitting device.

8. The light emitting device package as claimed in claim 1, wherein the second electrodes have an inserting portion projected downward.

9. The light emitting device package as claimed in claim 8, wherein the inserting portion is inserted in, and mounted to, an inserting hole in a circuit board.

10. The light emitting device package as claimed in claim 8, wherein the inserting portion is two or more than two branches from one first electrode.

11. The light emitting device package as claimed in claim 1, wherein the double reflective layer or the multiple reflective film is positioned between the light emitting device and the light wavelength conversion layer.

12. The light emitting device package as claimed in claim 1, wherein the first electrodes contact the protective layer.

13. The light emitting device package as claimed in claim 2, wherein the first electrodes are positioned on a side of the adhesive layer.

14. The light emitting device package as claimed in claim 1, wherein the first electrodes are positioned between the first surface and the protective layer.

15. The light emitting device package as claimed in claim 1, wherein the light wavelength conversion layer is arranged between the protective layer and the double reflective layer or the multiple reflective film.

16. The light emitting device package as claimed in claim 6, wherein the double reflective layer or the multiple reflective film contacts the encapsulation.

17. The light emitting device package as claimed in claim 1, wherein the double reflective layer or the multiple reflective film transmits a blue light (B) while reflecting other lights including a red light (R) and a green light (G).

18. The light emitting device package as claimed in claim 1, wherein the first electrodes and the adhesive layer contact the protective layer.

19. The light emitting device package as claimed in claim 1, wherein the light wavelength conversion layer is between the protective layer and the double reflective layer or multiple reflective film.

* * * * *